(12) United States Patent
Shake et al.

(10) Patent No.: US 10,295,593 B2
(45) Date of Patent: May 21, 2019

(54) OPERATING GENERAL PURPOSE HARDWARE AS RADIO

(71) Applicant: Raytheon BBN Technologies Corp., Cambridge, MA (US)

(72) Inventors: Tyler Shake, Sykesville, MD (US); Joshua N. Edmison, Ellicott City, MD (US); John Dishon, San Diego, CA (US); John-Francis Mergen, Baltimore, MD (US); Zachary Leuschner, Fairfax, VA (US); Christopher Wilder, Cockeysville, MD (US); Thomas Wilkerson, Baltimore, MD (US)

(73) Assignee: Raytheon BBN Technologies Corp., Cambridge, MA (US)

( * ) Notice: Subject to any disclaimer, the term of this patent is extended or adjusted under 35 U.S.C. 154(b) by 0 days.

(21) Appl. No.: 16/193,713

(22) Filed: Nov. 16, 2018

(65) Prior Publication Data

US 2019/0086470 A1 Mar. 21, 2019

Related U.S. Application Data

(63) Continuation-in-part of application No. 15/259,760, filed on Sep. 8, 2016.

(60) Provisional application No. 62/316,913, filed on Apr. 1, 2016.

(51) Int. Cl.
*G01R 31/302* (2006.01)

(52) U.S. Cl.
CPC ............................. *G01R 31/3025* (2013.01)

(58) Field of Classification Search
None
See application file for complete search history.

(56) References Cited

U.S. PATENT DOCUMENTS

| | | | |
|---|---|---|---|
| 5,491,631 A | 2/1996 | Shirane et al. | |
| 7,941,248 B1 | 5/2011 | Tsamis et al. | |
| 9,527,608 B1 * | 12/2016 | Sotnikov | B64G 1/54 |
| 9,740,975 B2 | 8/2017 | Gibson et al. | |
| 10,121,294 B1 | 11/2018 | Dishon et al. | |
| 2003/0158954 A1 | 8/2003 | Williams | |

(Continued)

OTHER PUBLICATIONS

U.S. Appl. No. 15/259,760, filed Sep. 8, 2016, Apparatus and Method for Remote Analysis of a Target Device.

(Continued)

*Primary Examiner* — Carlos Garcia
(74) *Attorney, Agent, or Firm* — Schwegman Lundberg & Woessner, P.A.

(57) ABSTRACT

Embodiments includes an apparatus and method that intentionally illuminate a device with RF energy having specific characteristics (e.g., frequency, power, waveform, directionality, duration, etc.) to make a conductor of the device a transmitter. A method can include identifying data to be transmitted by the one or more conductors and providing a signal to the electrical or electronic circuitry to cause the electrical or electronic circuitry to change state and produce a first signal on the one or more conductors. The one or more conductors can produce a forced non-linear emission (FNLE) that is a mixture of the first signal and an electromagnetic wave incident thereon that, when decoded by an external device, corresponds to the data.

20 Claims, 11 Drawing Sheets

(56) References Cited

U.S. PATENT DOCUMENTS

| | | | |
|---|---|---|---|
| 2005/0128074 | A1 | 6/2005 | Culpepper et al. |
| 2010/0056207 | A1 | 3/2010 | Yang |
| 2010/0097187 | A1 | 4/2010 | Hill |
| 2010/0112954 | A1 | 5/2010 | Son |
| 2011/0061605 | A1 | 3/2011 | Hardi et al. |
| 2011/0170103 | A1* | 7/2011 | Gomez Rivas .... G01N 21/6428 356/445 |
| 2013/0056532 | A1 | 3/2013 | Hasegawa |
| 2014/0214263 | A1 | 7/2014 | Boucher et al. |
| 2015/0102105 | A1 | 4/2015 | Perret et al. |
| 2015/0120578 | A1 | 4/2015 | Roddy et al. |
| 2015/0186695 | A1 | 7/2015 | Hill |
| 2016/0013657 | A1 | 1/2016 | Jeong et al. |
| 2017/0288788 | A1 | 10/2017 | Dishon et al. |
| 2017/0288789 | A1 | 10/2017 | Dishon et al. |
| 2017/0289786 | A1 | 10/2017 | Dishon et al. |
| 2018/0150344 | A1 | 5/2018 | Kim et al. |

OTHER PUBLICATIONS

U.S. Appl. No. 15/375,834, filed Dec. 12, 2016, Automated Avionics Testing.
U.S. Appl. No. 15/362,121, filed Nov. 28, 2016, Apparatus and Method for Rapid Electronic Device Discovery.
U.S. Appl. No. 15/676,518, U.S. Pat. No. 10,121,294, filed Aug. 14, 2017, Rapid Document Detection and Identification.
"U.S. Appl. No. 15/259,760, Non Final Office Action dated Jun. 20, 2018", 12 pgs.
"U.S. Appl. No. 15/259,760, Response filed Oct. 15, 2018 to Non-Final Office Action dated Jun. 20, 2018", 9 pgs.
"U.S. Appl. No. 15/362,121, Non Final Office Action dated Jun. 28, 2018", 15 pgs.
"U.S. Appl. No. 15/362,121, Response filed Oct. 15, 2018 to Non-Final Office Action dated Jun. 28, 2018", 10 pgs.
"U.S. Appl. No. 15/375,834, Non Final Office Action dated Jun. 22, 2018", 19 pgs.
"U.S. Appl. No. 15/375,834, Response filed Oct. 15, 2018 to Non-Final Office Action dated Jun. 22, 2018", 9 pgs.
"U.S. Appl. No. 15/676,518 Response filed Apr. 30, 218 to Non Final Office Action dated Dec. 28, 2017", 10 pgs.
"U.S. Appl. No. 15/676,518, Examiner Interview Summary dated Apr. 9, 2018", 3 pgs.
"U.S. Appl. No. 15/676,518, Non Final Office Action dated Dec. 28, 2017", 12 pgs.
"U.S. Appl. No. 15/676,518, Notice of Allowance dated Jun. 12, 2018", 10 pgs.
"GNU Radio Website", WaybackMachine: www.gnuradio.org, (Nov. 2015), 4 pgs.
"NSA Tempest Documents", [Online]. Retrieved from the Internet: <URL: https://cryptome.org/nsa-tempest.htm>, (Accessed Oct. 30, 2015), 2 pgs.
"Ramsey RF Shielded Test and Forensics Enclosures", Ramseytest.com—Nov. 2015, (Oct. 26, 2015), 2 pgs.
Agrawal, Dakshi, et al., "Multi-channel Attacks", Cryptographic Hardware and Embedded Systems—CHES 2003, vol. 2779, (2003), 2-16.
Agrawal, Dakshi, et al., "The EM Side-Channel(s)", Cryptographic Hardware and Embedded Systems—CHES 2002, vol. 2523, (2002), 29-45.
Agrawal, Dakshi, et al., "The EM Side-Channel(s): Attacks and Assessment Methodologies", Proceedings of the 4th International Workshop on Cryptographic Hardware and Embedded Systems, (2002), 1-42.
Batina, Lejla, et al., "Mutual Information Analysis: A Comprehensive Study", J. Cryptol., vol. 24, No. 2, (Apr. 2011), 269-291.
Bayrak, Ali, et al., "First Step Towards Automatic Application of Power Analysis Countermeasures", Proceedings of the 48th Design Automation Conference, (2011), 230-235.
Callan, Robert, et al., "A Practical Methodology for Measuring the Side-Channel Signal Available to the Attacker for Instruction-Level Events", Proceedings of the 47th Annual IEEE/ACM International Symposium on Microarchitecture (MICRO), (Dec. 2014), 242-254.
Callan, Robert, et al., "Comparison of Electromagnetic Side-Channel Energy Available to the Attacker from Different Computer Systems", IEEE International Symposium on Electromagnetic Compatibility (EMC),, (2015), 219-223.
Callan, Robert, et al., "FASE: Finding Amplitude-modulated Side-channel Emanations", Proceedings of the 42Nd Annual International Symposium on Computer Architecture, (2015), 592-603.
Clark, Shane, "The Security and Privacy Implications of Energy—Proportional Computing (Dissertations. Paper 782)", University of Massachusetts Amherst, (2013), 125 pgs.
Compston, James, et al., "A Fundamental Limit on Antenna Gain for Electrically Small Antennas", IEEE 2008 Sarnoff Symposium, (2008), 1-5.
Cui, Ang, "A Quantitative Analysis of the Insecurity of Embedded Network Devices: Results of a Wide-Area Scan", Proceedings of the 26th Annual Computer Security Applications Conference, (2010), 97-106.
Dasilva, Luiz, et al., "Requirements of an Open Platform for Cognitive Networks Experiments", 3rd IEEE Symposium on New Frontiers in Dynamic Spectrum Access Networks, (2008), 1-8.
Del Pozo, Santos, et al., "Blind Source Separation from Single Measurements Using Singular Spectrum Analysis", Cryptographic Hardware and Embedded Systems—CHES 2015, vol. 9293, (2015), 42-59.
Dysart, Paul, et al., "Regional Seismic Event classification at the NORESS array: Seismological Measurements and the Use of Trained Neural Networks", Bull. Seismol. Soc. Am., vol. 80, No. 6B, (Dec. 1990), 1910-1933.
Flintoff, Ian D., et al., "The Re-Emission Spectrum of Digital Hardware Subjected to EMI", IEEE Transactions on Electromagnetic Compatibility, vol. 45, No. 4,, (Nov. 2003), 11 pgs.
Gandolfi, Karine, et al., "Electromagnetic Analysis: Concrete Results", Cryptographic Hardware and Embedded Systems—CHES 2001, vol. 2162, (2001), 251-261.
Gierlichs, Benedikt, et al., "Mutual Information Analysis: A Generic Side-Channel Distinguisher", Cryptographic Hardware and Embedded Systems—CHES 2008, vol. 5154, (2008), 426-442.
Hastie, T, et al., "", the Elements of Statistical Learning, Springer New York, (2009), 763 pgs.
Kim, Tae Hyun, et al., "Side channel analysis attacks using AM demodulation on commercial smart cards with Seed", The Journal of Systems and Software 85 (12), (Dec. 2012), 2899-2908.
Knight, John, et al., "Automated Classification of Active Acoustic Returns", Radix Systems, Inc., (Apr. 9, 1993), 16 pgs.
Kocher, Paul, et al., "Introduction to differential power analysis", J. Cryptogr. Eng., vol. 1, No. 1, (Apr. 2011), 5-27.
Kuhn, Markus, "Security Limits for Compromising Emanations", Cryptographic Hardware and Embedded Systems—CHES 2005, vol. 3659, (2005), 265-279.
Lakshminarayanan, Kaushik, et al., "RFDump: An Architecture for Monitoring the Wireless Ether", Proceedings of the 5th International Conference on Emerging Networking Experiments and Technologies, (2009), 253-264.
Li, Huiyun, et al., "Security Evaluation Against Electromagnetic Analysis at Design Time", Cryptographic Hardware and Embedded Systems—CHES 2005, vol. 3659, (2005), 280-292.
Meynard, Olivier, et al., "Enhancement of Simple Electro-Magnetic Attacks by Pre-characterization in Frequency Domain and Demodulation Techniques", Design, Automation Test in Europe Conference Exhibition, (2011), 1-6.
Montminy, D P, "Enhancing Electromagnetic Side-Channel Analysis in an Operational Environment (Dissertation)", Air Force Institute of Technology, (Sep. 2013), 247 pgs.
Muccioli, J P, et al., "Characterization of the RF Emissions from a family of microprocessors using a 1 GHz TEM cell", IEEE 1997 International Symposium on Electromagnetic Compatibility,, (1997), 203-207.
Muccioli, J P, et al., "Investigation of the theoretical basis for using a 1 GHz TEM cell to evaluate the radiated emissions from inte-

(56) References Cited

OTHER PUBLICATIONS grated circuits", IEEE 1996 International Symposium on Electromagnetic Compatibility, 1996. Symposium Record., (1996), 63-67.

Oliphant, T. E., "Python for Scientific Computing", Comput. Sci. Eng., vol. 9, No. 3, (May 2007), 10-20.

O'Shea, Timothy, et al., "Practical Signal Detection and Classification in GNU Radio", SDR Forum Technical Conference, (2007), 6 pgs.

Pedregosa, F, et al., "Scikit-learn: Machine Learning in Python", J Mach Learn Res, vol. 12, (Nov. 2011), 2825-2830.

Peeters, Eric, et al., "Power and electromagnetic analysis: Improved model, consequences and comparisons", Integr. VLSI J., vol. 40, No. 1, (Jan. 2007), 52-60.

Pulli, Jay, "Analysis of the Jan. 2015 Plainfield, CT Earthquake Sequence Using Waveform Correlation Techniques", Presented at the 87th Annual Meeting Eastern Section Seismological Society of America, University of Memphis., (Oct. 7, 2015), 18 pgs.

Pulli, Jay, "Instantaneous Power Calculations for the Patrick Alpha Acoustic Projector", Analysis Staff Technical Memorandum, (Sep. 5, 1989), 19 pgs.

Quisquater, J J, et al., "ElectroMagnetic Analysis (EMA): Measures and Counter-measures for Smart Cards", Smart Card Programming and Security, vol. 2140, (2001), 200-210.

Richard, Linhart, et al., "Measuring RF Circuits Response Using Software Defined Radio System", IEEE, Print ISBN: 978-8-0261-0276-2, (Jan. 19, 2015).

Sarihari, Mohd Adib, et al., "Energy Detection Sensing based on GNU Radio and USRP: An Analysis Study", IEEE 9th Malaysia International Conference on Communications (MICC), (2009), 338-342.

Sharan, Ravi, et al., "The Comprehensive GNU Radio Archive Network", [Online]. Retrieved from the Internet: <URL: http://www.cgran.org/ >, (Nov. 2015), 5 pgs.

Shaw, et al., "Software Defined Radio as a solution to testing RF avionics", IEEE, Electronic ISBN: 978-1-4799-3005-0, (Sep. 15-18, 2014).

Van Der Walt, S, et al., "The NumPy Array: A Structure for Efficient Numerical Computation", Comput. Sci. Eng., vol. 13, No. 2, (Mar. 2011), 22-30.

Vick, Ralf, et al., "The Dependence of the Immunity of Digital Equipment on the Hardware and Software Structure", (1997), 383-386.

Vuagnoux, Martin, et al., "An Improved Technique to Discover Compromising Electromagnetic Emanations", IEEE International Symposium on Electromagnetic Compatibility (EMC),, (2010), 121-126.

Vuagnoux, Martin, et al., "Compromising Electromagnetic Emanations of Wired and Wireless Keyboards", USENIX security symposium, (2009), 1-16.

Zajic, Alenka, et al., "Experimental Demonstration of Electromagnetic Information Leakage From Modern Processor-Memory Systems", IEEE Trans. Electromagn. Compat., vol. 56, No. 4, (Aug. 2014), 885-893.

"U.S. Appl. No. 15/375,834, Notice of Allowance dated Dec. 13, 2018", 11 pgs.

"U.S. Appl. No. 15/259,760, Notice of Allowance dated Jan. 4, 2019", 11 pgs.

"U.S. Appl. No. 15/362,121, Notice of Allowance dated Dec. 10, 2018", 14 pgs.

"Sbir Investments in Software Defined Radio Technology", NASA, (2012), 60 pgs.

Charlotte, Adams, "SDR Takes Flight", Aviation Today, [Online] Retrieved from the internet:https: www.aviationtoday.com Feb. 1, 2013 sdr-takes-flight , (Feb. 1, 2013), 4 pgs.

Huang, "A Hands-on Project for Avionics Systems Course in Aviation Engineering Technology Program", American Society for Engineering Education, Paper ID #21075, (2018), 17 pgs.

Joseph, M Jacob, "The next advancements in Software-Defined Radio", Summer 2006, Reprinted from Military Embedded Systems, (2006), 4 pgs.

Kimionis, "Design and Implementation of RFID Systems with Software Defined Radio", IEEE, 6th European Conference on Antennas and Propagation (EUCAP), 978-1-4577-0919-7 12 $26.00, (2011), 3464-3468.

Machado-Fernandez, Jose Raul, "Software Defined Radio: Basic Principles and Applications", Revista Facultad de Ingenieria, vol. 24. No. 38, ISSN 0121-1129, eISSN 2357-5328, (Year: 2015), (Sep. 29, 2014), 79-96.

Mashkov, "Experimental Validation of Multipoint Joint Processing of Range Measurements via Software-Defined Radio Testbed", ICACT2016, ISBN 978-89-968650-6-3, (Jan. 31-Feb. 3, 2016), 268-273.

Remya, "GNU Radio Based BIST for SDR Performance Measurement", IEEE, 978-1-4799-5958-7114 $31.00, (2014), 4 pgs.

Yeste-Ojeda, "Software Defined Radio Approach to Distance Measuring Equipment", IEEE, 978-1-4799-3320-4 14 $31.00, (2014), 680-685.

\* cited by examiner

OPERATING GENERAL PURPOSE HARDWARE AS RADIO

RELATED APPLICATIONS

This application is a continuation-in-part of U.S. patent application Ser. No. 15/259,760 titled "Apparatus and Method for Remote Analysis of a Target Device" and filed on Sep. 8, 2016, which application claims the priority benefit of U.S. Provisional Application Ser. No. 62/316,913 titled "Forced Non-Linear Emissions" and filed on Apr. 1, 2016. This application is also related to U.S. patent application Ser. No. 15/362,121 titled "Apparatus and Method for Rapid Electronic Device Discovery" and filed on Nov. 28, 2016; U.S. patent application Ser. No. 15/375,834 titled "Automated Avionics Testing" and filed on Dec. 12, 2016 and U.S. patent application Ser. No. 15/676,518 titled "Rapid Document Detection and Identification' and filed on Aug. 14, 2017, the contents of all of which are hereby incorporated herein by reference in their entirety.

TECHNICAL FIELD

Embodiments pertain to causing a device to provide emissions that are used for transmitting data. Some embodiments pertain to the apparatus and methods for, and the data obtained from illuminating target devices with intentional radio frequency (RF) energy and receiving and decoding resulting signals emanated from a target device.

BACKGROUND

Over at least the past thirty-five years or so there has been a continuing interest in the ability to sense what computing systems are doing from afar. A number of methods have been explored, including receiving inadvertent radio emissions, visible light examination, magnetic sensing, temperature sensing, multispectral analysis, and acoustic sensing. All the previous methods have been limited in a combination of precision, range, and general applicability. Known methods for observing target device characteristics and behavior during operation require some combination of software and/or hardware resident on the target device, knowledge of target device communication protocols and modalities, and/or close physical access to the target device. Current and past techniques thus require substantial a priori knowledge, are potentially invasive to target device operation, and are susceptible to erroneous or even malicious activities on the target device.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
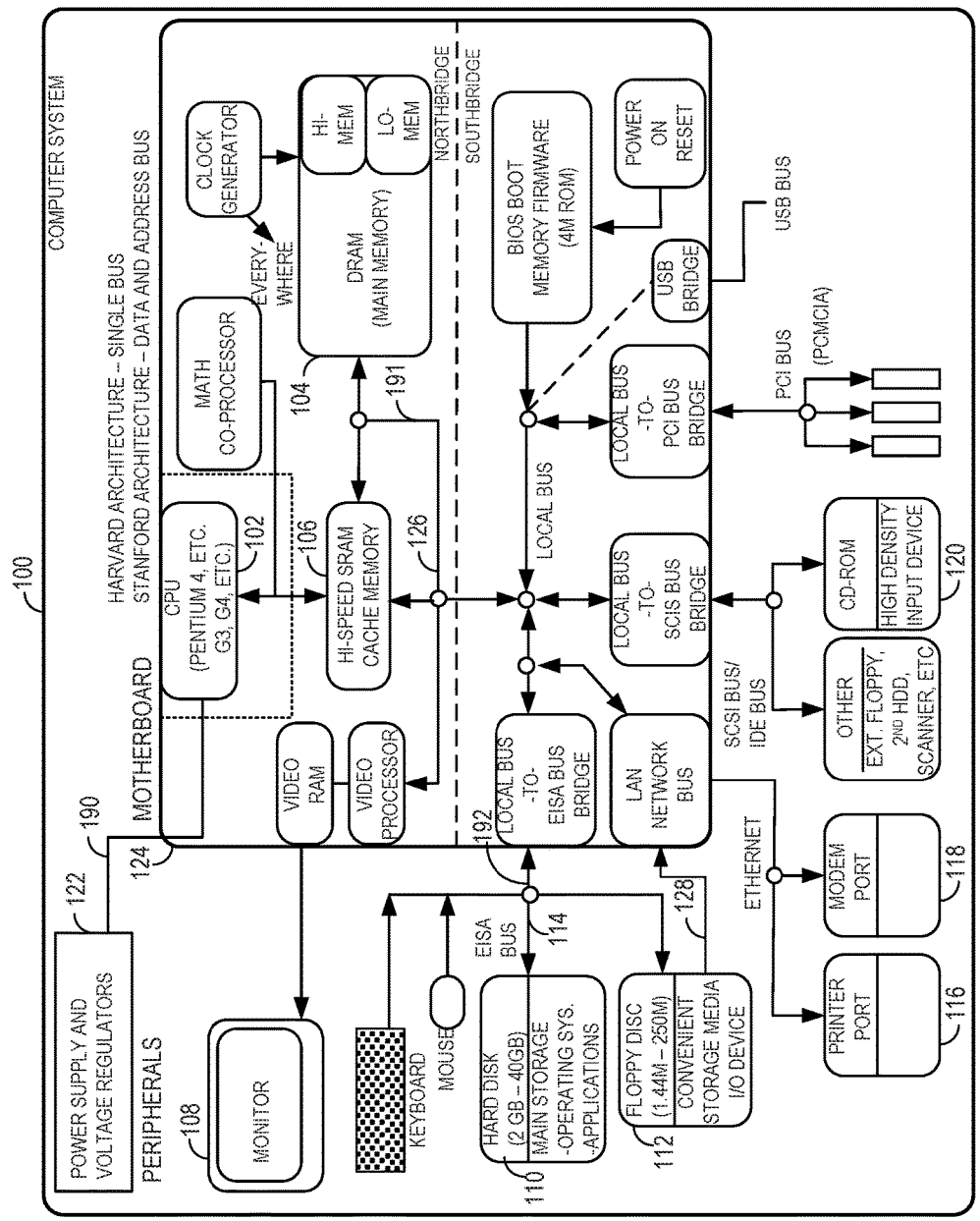
FIG. 1 shows a block diagram of an example target device, in accordance with various embodiments.

The present inventors have recognized, among other things, that improvements of the apparatus and methods used for analyzing remotely located target devices, such as computing systems, are possible and would enable specific distinct advantages.

In an example, a software defined radio (SDR) apparatus configured to remotely analyze a target device may include transmitter circuitry configured to illuminate the target device with electromagnetic energy that mixes with operational electromagnetic signals in the target device to produce forced non-linear emissions that radiate from the target device, and receiver circuitry configured to receive the forced non-linear emissions from the target device for subsequent analysis and evaluation.

In an example, a method of remotely analyzing a target device may include illuminating a target device using transmitter circuitry that outputs configured electromagnetic energy that mixes with operational electromagnetic signals in the target device to produce forced non-linear emissions that radiate from the target device, and receiving the forced non-linear emissions using receiver circuitry for subsequent analysis and evaluation.

In an example, a non-transitory computer-readable storage medium that stores instructions for execution by processing circuitry of an SDR, to configure the SDR to illuminate a target device using transmitter circuitry that outputs configured electromagnetic energy that mixes with operational electromagnetic signals in the target device to produce forced non-linear emissions that radiate from the target device, and to receive the forced non-linear emissions using receiver circuitry for subsequent analysis and evaluation.

The inventive examples described below may address the shortcomings of previous efforts and enable advantageous remote sensing and characterization of a target device or system. This disclosure describes systems and methods for characterizing, observing, and measuring target devices from a standoff distance limited only by the ability to place RF energy on the target devices and properties of the target devices. The solution provided requires no a priori knowledge of devices, may be tailored to avoid impacting target device operation and does not require physical access to the target device. The disclosed examples leverage the analog properties of a target device, present in both analog and digital elements, to extract useful information about the target device.

The examples described make novel use of involuntary analog emissions from all classes of target devices to enhance cyber defense. This approach may exploit the signal content of forced electromagnetic (EM) emissions from illuminated target devices. The non-linear properties of the forced emissions enable circumvention of shielding and greatly decrease the likelihood of a target device, including both its software and hardware, manipulating the measurements. The solution provided thus enables assessment of the operations of many heterogeneous target devices remotely and efficiently.

The example system may comprise illumination devices or transmitter circuits for producing electromagnetic energy, and receiver devices or circuits for receiving forced emissions. The methods may extract the key re-emission signals from noise and analyze the resulting signal data for behaviors. The data obtained may enable defense contractors to assess reemission characteristics of military systems, allow civilian consumers to monitor their home devices, and enable businesses to monitor their enterprises.

FIG. 1 shows a block diagram of an example target device 100 in accordance with some embodiments. In this example, the target device is a personal computer (pc) system, though many other types of electronic circuits may also be investigated via the forced emission approach, including cell phones, pagers, and other consumer electronic devices, as well as avionics systems. The disclosure is not limited in this respect, however.

The target device 100 may comprise a variety of components that each may operate at a given clock frequency or data transfer rate. For example, a central processing unit (CPU) 102 may be the highest speed component in the target device, with a clock speeds often between 400 MHz to over 2 GHz. Memory systems 104 and 106 may transfer data to and from the CPU 102 at a somewhat lower speed that may depend on the bandwidth of printed circuit board traces, e.g., 133 MHz. The target device 100 may generate video data for display on a monitor 108, with data rates of perhaps four MHz.

Each of these devices may transfer data over pathways that use known frequency ranges. Primary data storage devices such as a hard disk drive 110 or a floppy disc unit 112 may communicate with the CPU 102 via an interface bus 114, such as the well-known EISA personal computer bus. Peripheral devices that provide data transfer are also familiar to one of ordinary skill in the art of computer systems. Printers 116, modems 118, scanners, mice, keyboards, CD-ROM drives 120, and PCMCIA cards for example often use standardized interfaces that may operate at known data exchange rates or at least identifiable ranges thereof.

As shown in FIG. 1 in bold, electromagnetic energy may be injected into the target device 100 through various channels. For example, the connection between a target device's power supply 122 and a main motherboard 124 may receive intentionally applied illumination. The result may be that the normally regulated supply voltages provided to power the various components of the target device 100 may be altered. The incoming illumination or electromagnetic radiation may be distributed throughout the target device 100 via the power supply network.

The externally generated illumination may also be injected via primary interface bus 126 and peripheral interface buses 114 and 128, as also shown in bold. The applied electromagnetic energy may mix with signals transferring to and from the CPU 102, producing forced non-linear emissions that radiate away. In one example, the forced non-linear emissions may radiate from one or more antennas of the target device, although the disclosure is not limited in this respect. The forced emissions may be analyzed to determine the signals that were transferring to and from the CPU 102.

Figure 2:
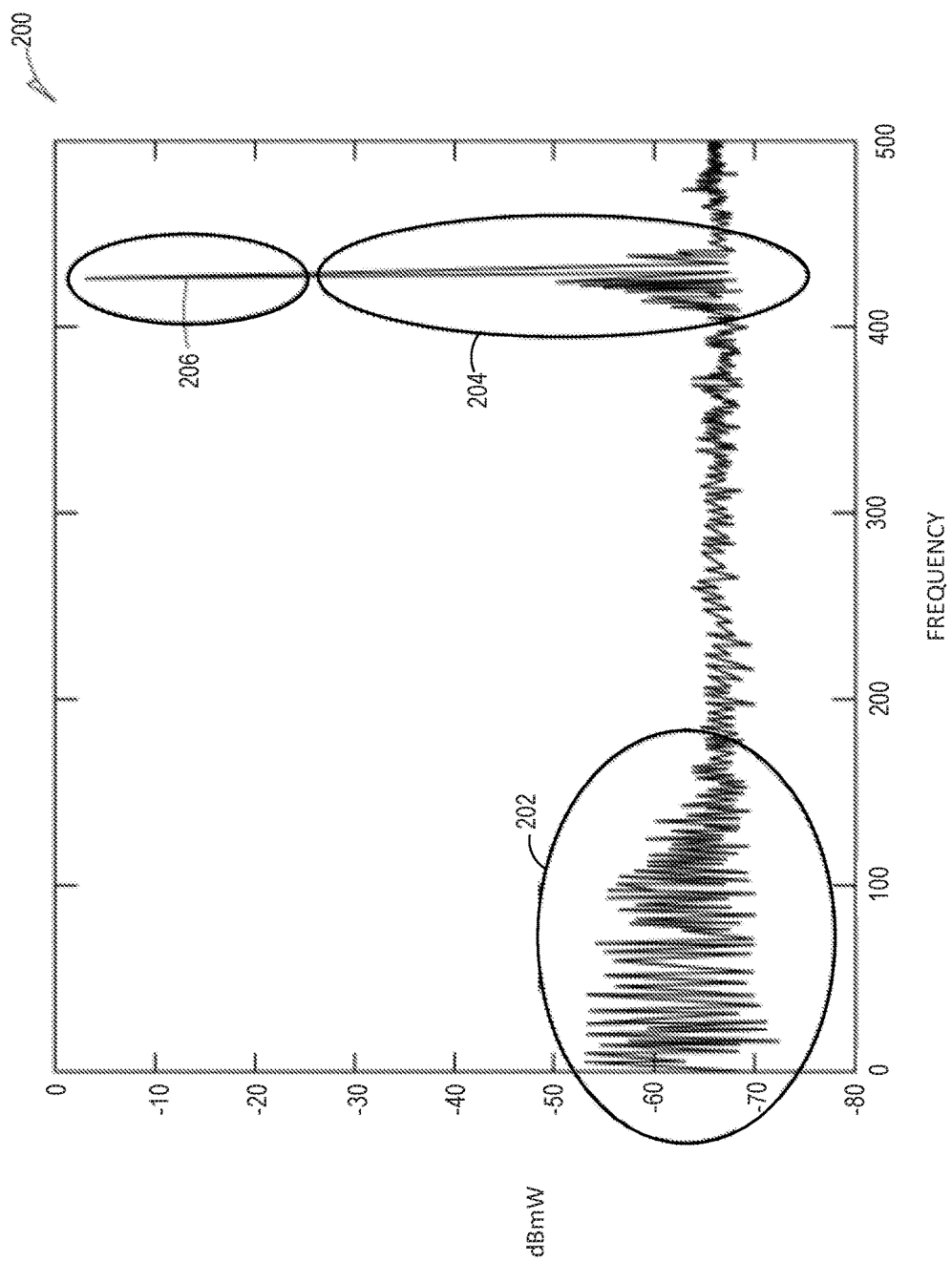
FIG. 2 shows a plot of an example spectrum of emitted electromagnetic power versus frequency emitted by a target device, in accordance with various embodiments.

FIG. 2 shows plot of an example spectrum of emitted electromagnetic power versus frequency 200 emitted by a target device, in accordance with various embodiments. At the lower end of the frequency range, a variety of unintended emissions 202 are shown. Digital devices of all types emit unintentional RF. When illuminated with intentional RF energy, electronic devices may emit forced non-linear emissions (FNLE) 204, also described as the re-emission spectrum. The FNLE 204 are the result of superheterodyne-like mixing of normal operating signals with the externally applied illumination. The large peak 206 shown represents the carrier wave of the intentional illumination signal. On either side of the large peak 206, the re-emission spectrum of the forced non-linear emissions 204 is shown. In general, the FNLE 204 manifests as sidebands around a carrier frequency and is largely dependent upon the physical characteristics of the target device 100 (e.g., its hardware, software, and operating state). The FNLE 204 may contain considerable information about the interaction of the illuminating RF energy and the target device 100.

The examples provided may illuminate a target device 100 (sometimes called a system under test (SUT)) with RF waveforms swept across a broad range of frequencies. Illuminating a SUT generates mixed signal products, e.g., signals resulting from the combination of the illumination signal and existing on-board SUT signals. This mixing provides unique signal characterization opportunities that may be exploited by several exemplary and non-limiting embodiments. These opportunities may include:

Increased signal detection range: Illumination may provide a carrier signal that mixes with signals present in the target system. This interaction may produce a mixed signal, an FNLE 204, with improved signal strength that can be detected at a greater range. Experimental tests suggest that a gain of 50 dB may be expected over emissions occurring without illumination. The corresponding improvement in signal-to-noise ratio enables remote sensing improvement goals in various environments. Further, in one example, the forced non-linear emissions 204 may radiate from the target device 100 via an antenna of the target device 100, further increasing the detection range for a given illumination power. The frequency of the illumination energy may be configured to avoid interference with signals that radiate from the target system antenna during normal operation of the target device 100. However, the scope of this disclosure is not limited in this respect.

Increased signal fidelity: Illumination mixing produces a host of new FNLE 204 at new frequencies. These emissions are probably unanticipated by the target system's designers and are thus unlikely to be RF shielded or suppressed. The effects of illumination may therefore provide a broader, more complex set of signals for analysis. This wider range of signal information about the target device 100 may aid in the characterization of the target device 100.

Increased information content on the SUT's operational state: The cross modulation and intermodulation products within the FNLE 204 generated may have their origins in many parts of the target device 100. Examples include but are not limited to mixed signals due to clock transitions, FM signals produced by mixing with data on memory and address busses, induced non-linear signals with complex harmonic structures caused by changing the operating regime of semiconductors, and mixing products generated by systems on a chip. All of these may produce signatures that when combined denote characteristics underlying the operation of the target device 100, e.g., its presence or a count of multiple target devices present, and its "health" or conformance to desired operational behaviors. It may also be possible to discern the presence of a number of particular instances of a component in the target device 100, enabling inventory control and situational awareness through a survey of detected devices. The signal data generated by for example software defined radio (SDR) based test pods may be analyzed using non-linear classification and data mining methods to exploit the complex nature of the signal features (e.g., phase and harmonic structures) to characterize target device 100 operations. The additional signal content available from FNLE 204 may enable desired classification accuracy.

General operational applicability: The excitation mechanism and receivers in one exemplary implementation are an SDR system. SDRs may automatically illuminate SUTs at multiple frequencies and waveforms to characterize and analyze the operation of the SUT. That is, multiple illumination signals may be applied simultaneously to induce multiple forced non-linear emissions 204. However, the disclosure is not limited in this respect.

The disclosed examples may form the basis of a new security/monitoring capability for protecting IoT (Internet of things) circuits or similar devices by monitoring their behavior at a physical level from a standoff distance. They may also form the basis of a counterfeit detection capability or erroneous operation capability for aircraft, ships, land vehicles, or other platforms. The examples provided may also enable new methodologies for low bandwidth communication.

Figure 3:
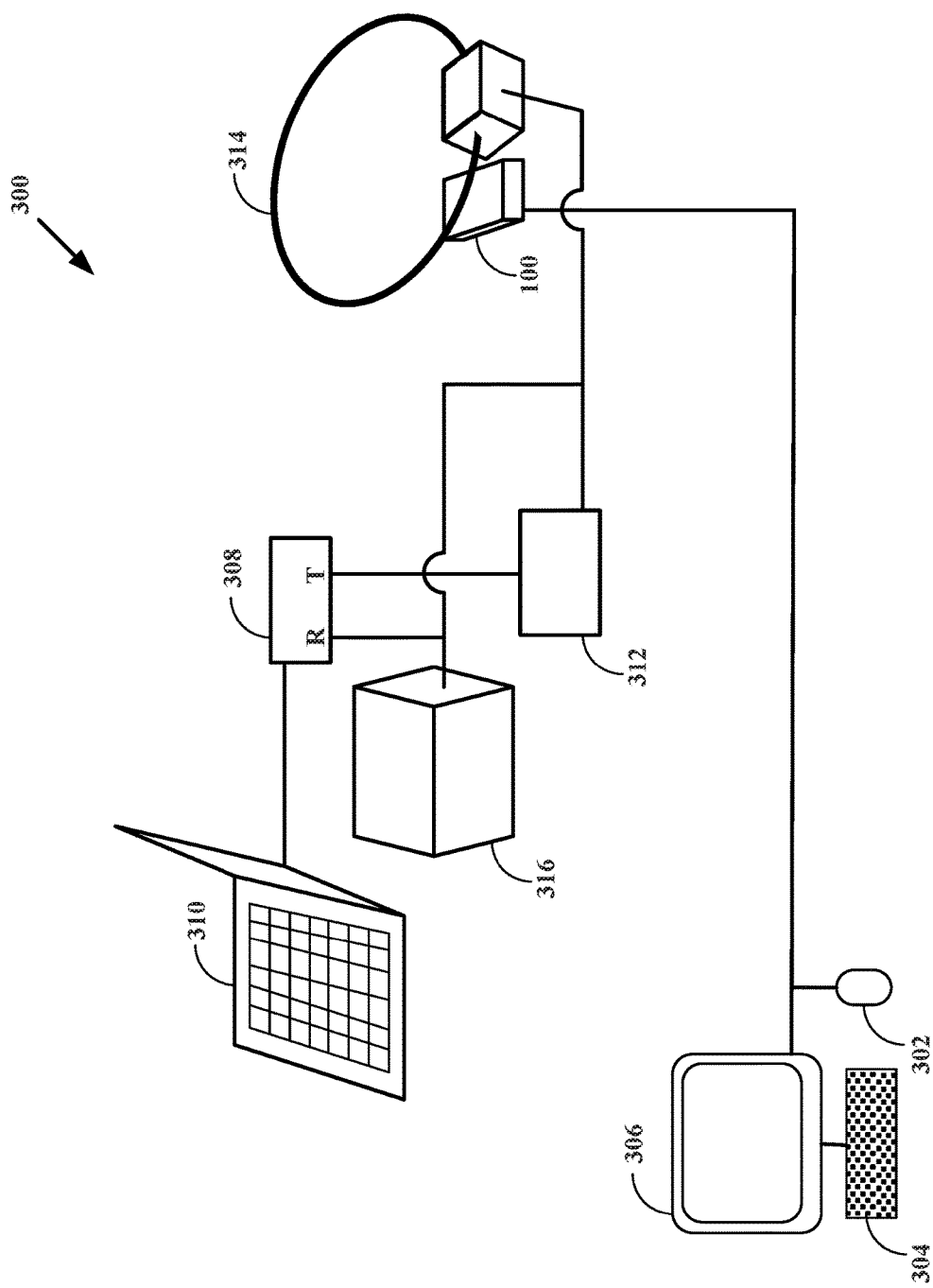
FIG. 3 shows a block diagram of an example forced non-linear emission apparatus, in accordance with various embodiments.

FIG. 3 shows a block diagram of an example forced non-linear emission system 300, in accordance with various embodiments. An initial implementation has demonstrated the concept has been reduced to practice. In this example, the target device is a Raspberry Pi® microcomputer, available from the Raspberry Pi Foundation. A mouse 302, keyboard 304, and monitor 306 are connected to the target device 100 to enable a user to control its operations.

A typical illumination apparatus may comprise one or more RF emitters or transmitter circuits positioned at some distance from the target device 100. The distance from the target device 100 may be fixed or variable, enabling operation on a moving platform based on air, sea, or land. Increased proximity to the target device 100 may reduce a required illumination power. One or more RF receiver circuits may also be placed at a distance. Receivers may be placed farther away from the target device 100 than the emitters.

In this example, the receiver circuit and transmitter circuit comprise a software-defined radio transceiver 308, which is capable of operation from 70 MHz to 6 GHz. The transceiver 308 may be controlled for example by a laptop computer 310 that executes a software-defined radio program with an AM demodulator. The output from the transceiver 308 may be fed into a frequency shifter 312 that may, for example, shift the transmitted signal upward in frequency by 125 MHz to produce an illumination signal. The illumination signal in this example drives a loop antenna 314, which may be driven directly as a transmitting antenna and tuned over a receiving frequency range of 650 kHz to 4.8 MHz by loop antenna tuning capacitor 316 to serve as a receiving antenna, for simplicity. The loop antenna 314 is shown suspended over the target device 100 by several inches, but the disclosure is not limited in this respect.

Illumination by one or more RF illuminators (including possible simultaneous illumination) may occur across a range of waveforms including but not limited to frequencies of one hundred (100) MHz to ten (10) GHz for example. The illumination frequency may vary incrementally at a predetermined step rate, such as in ten kHz steps. In addition to the frequency, other waveform parameters such as continuous or pulsed illumination type, repetition rate, duration, and power may be selected. Illumination with each waveform may occur for approximately two seconds for example but could occur for shorter or longer times depending on the target device 100 and the geometric configuration of the RF illuminators/receivers. If a specific waveform appropriate for the target device 100 is known, then those waveforms may be used instead of a sweep.

Approximately simultaneously with illumination, the receiving antennas may be receiving the FNLE 204 comprising the carrier waveform, sidebands, and other frequencies resulting from penetration by the illumination waveform(s) into the target device 100, non-linear mixing in the target device 100, and re-emission from the target device 100 to the receiver circuit. Depending on the type of target device 100 and the waveform properties, the re-emission may be enhanced by on-device antenna structures to enable reception of the FNLE 204 from a greater distance than re-emissions from a target device without an antenna. The received FNLE 204 may be collected over both a range of frequencies and time. Time may range from sub-millisecond spans to days, for example.

The received signals may be analyzed to extract target device 100 information. Applicable analysis technique examples may include analysis of the FNLE 204, spectrum variation over time, and calculation of cross-modulation products and/or third-order intermodulation products. From these techniques, various properties of the target device 100 may be assessed, such as state, activity, behavior, physical characteristics, or other observed phenomena. The return spectra may for example also be used to adaptively control the illumination based on the obtained target device 100 information. In an example, the illumination frequency may be changed for forced non-linear emissions 204 to avoid interference with normal target device 100 emissions. However, the disclosure is not limited in this respect.

Figure 4:
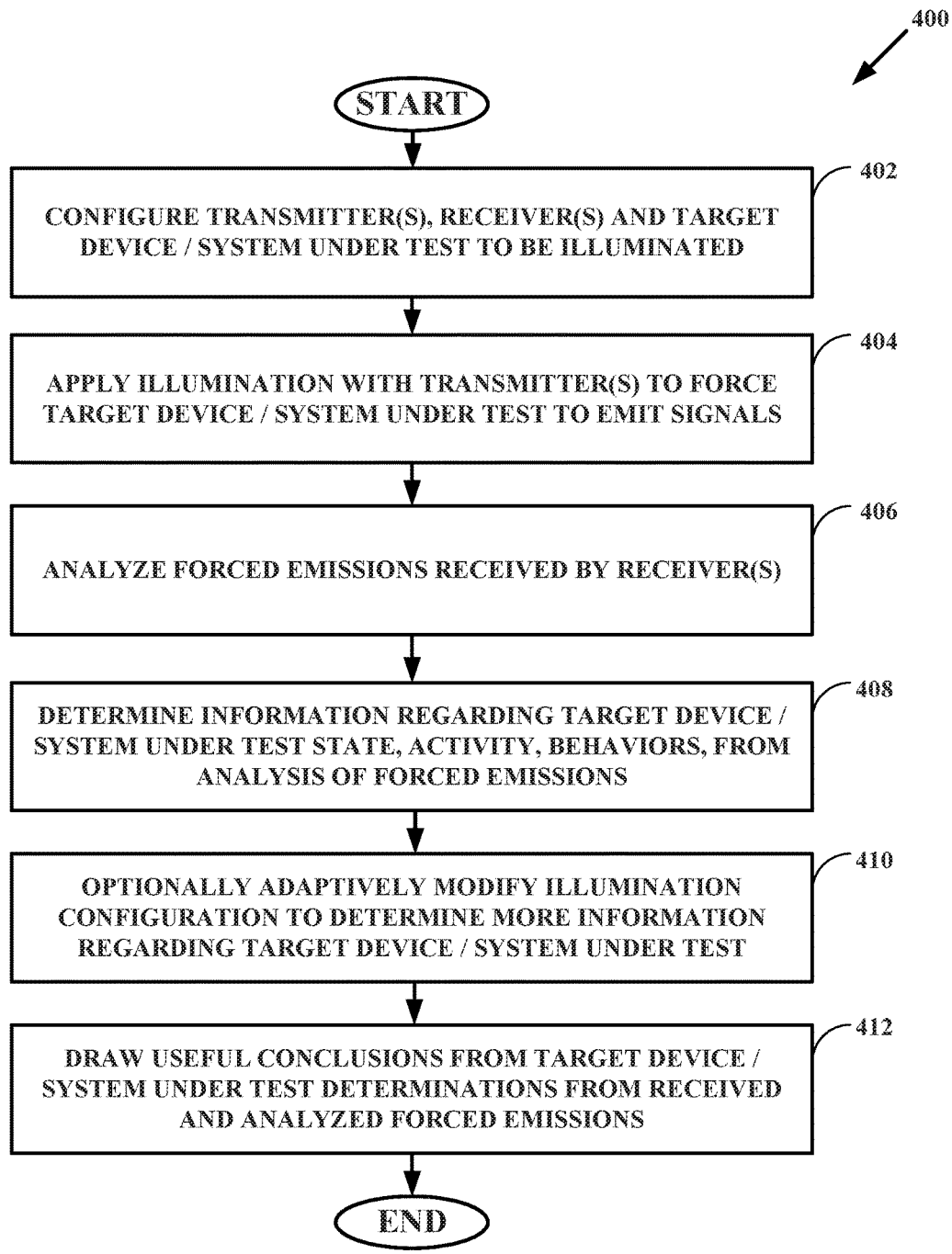
FIG. 4 shows a flowchart of an example of a forced non-linear emission method, in accordance with various embodiments.

FIG. 4 shows a flowchart of an example of a forced non-linear emission method, in accordance with various embodiments. At 402 the method may configure the transmitter circuits, receiver circuits, and the electromagnetic energy to be transmitted to the target device 100. For example, a user may define an output power, frequency range, sweep parameters, etc. to tailor the illumination to a given target device 100. At 404, the method may apply the illumination using the transmitter circuits to force the target device 100 to emit FNLE 204 resulting from the mixing of the illumination as previously described. At 406, the method may receive the FNLE 204 with the receiver circuits and analyze these emissions using a variety of analytical techniques. At 408, the method may determine useful information regarding the target device 100 from the analysis of the forced non-linear emissions 204. The information may for example describe the state, behavior, and characteristics of the target device 100. At 410, the method may, optionally, adaptively modify the illumination configuration to determine more information regarding the target device 100. For example, output power, illumination type (continuous or pulsed), and frequency values or sweep ranges may be altered in response to the analysis of previously applied illumination. At 412, the method may draw useful conclusions regarding the target device 100 from the received and analyzed forced non-linear emissions 204. For example, it may be determined that the target device 100 is active and is processing data, or it may be determined that the target device 100 is currently inoperative.

In one example embodiment, the target device 100 is an aircraft system or systems. Thus, the SDR system may be used to determine the status of aircraft systems prior to flight or after a flight. The subsequently described embodiment may be combined with any previously described embodiment.

Figure 5:
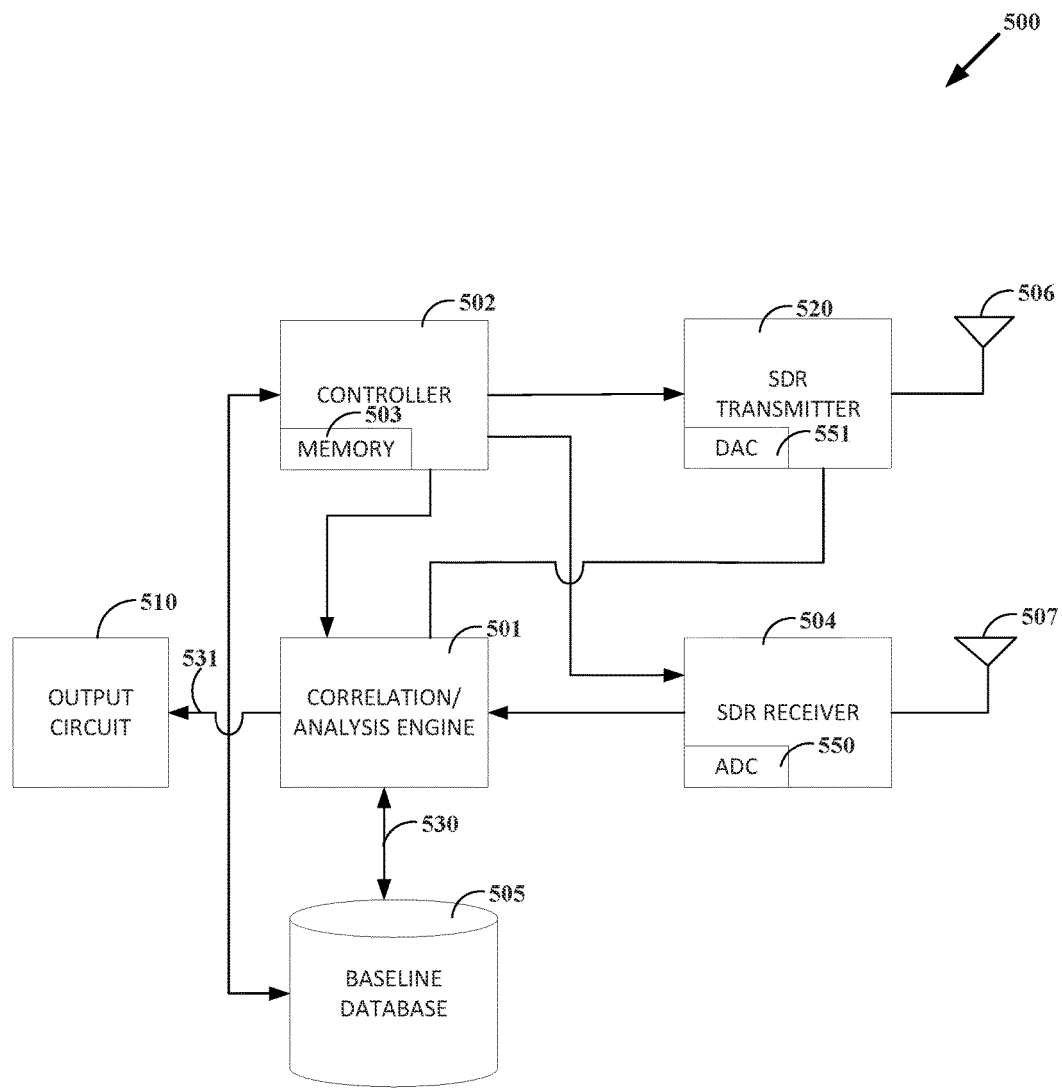
FIG. 5 shows a block diagram of a software defined radio (SDR) system, in accordance with various embodiments.

FIG. 5 shows a block diagram of an example of an SDR system 500, in accordance with various embodiments. The block diagram of the SDR system is for purposes of illustration only as one system that can implement automated aircraft systems testing.

The system includes a controller 502 for controlling operation of the system. The controller may be a central processing unit (CPU), microprocessor, reduced instruction set computer (RISC), or control circuitry comprising control logic. The controller 502 may include or be coupled to memory 503 to store operating instructions.

An input device 540 is coupled to the controller 502. The input device 540 may be a keyboard, keypad, or a touch-screen display for the user to enter data to the system. For example, the user may input a cockpit profile of the aircraft under test, as described subsequently.

The memory 503 may include at least one non-transitory computer-readable medium on which is stored one or more sets of data structures or instructions (e.g., software, firmware) embodying or utilized by any one or more of the techniques, methods, or functions described herein. The software, when executed by the controller 502, causes the hardware of the system to perform the specified operations of the methods described herein.

The memory 503 may include volatile memory and/or non-volatile memory. For example, the memory 503 may include one or more of random access memory (RAM), read only memory (ROM), erasable programmable read-only memory (EPROM) and electrically erasable programmable read-only memory (EEPROM), flash memory, or other memory technologies.

An SDR transmitter 520 is coupled to and controlled by the controller 502 and is configured to transmit signals as determined by the controller, such as the intentional RF energy as described previously. The transmitter 520 may include a modulator to modulate the signal in some way prior to transmission. The RF energy is radiated from an antenna 506 coupled to the transmitter 520. Power amplifiers in the transmitter 520 may adjust the transmit power of the intentional RF energy as determined by the controller 502. The SDR transmitter 520 may also include a digital-to-analog converter (DAC) 551 that converts signals from the controller 502 to analog signals for transmission.

An SDR receiver 504 is coupled to an antenna 507 to receive the signals radiated back from the aircraft systems. The receiver 504 may include a demodulator to demodulate any returned modulated signals. The SDR receiver 504 is also coupled to the controller 502 so that the controller 502 can control operation of the receiver 504 as necessary. The SDR receiver 504 may also include an analog-to-digital converter (ADC) 550 to convert the analog RF energy signal radiated from the aircraft systems into a digital representation of the RF energy.

A correlation and analysis circuitry 501 (e.g., correlation/analysis engine) is coupled to the SDR receiver 504, the controller 502, and the SDR transmitter 520. The correlation/analysis circuitry 501 receives signals from the SDR receiver 504 for analysis and correlation with signals stored in a database 505. The correlation/analysis circuitry 501 is coupled to an output circuit 510 that outputs the results of the correlation/analysis operation. The output circuit 510 may be a display, a printer, a voice response system, or some other way of informing a technician or a pilot of the results of the analysis of the aircraft systems.

A baseline database 505 is coupled to the correlation/analysis circuitry 501 and the controller 502. The database 505 is a mass memory storage device (e.g., magnetic drive, optical drive, solid state drive (SSD), tape drive) that stores representations of received RF energy representations and what each signal represents. The baseline database 505 stores known good (e.g., baseline) RF energy representations of avionics as described subsequently.

Both the controller 502 and the correlation/analysis circuitry 501 may access the database to write cockpit profiles and their respective associated received RF energy representations as well as to read the cockpit profiles and their associated received RF energy representations. As used herein, a cockpit profile may be defined as a listing of avionics that are installed in a particular aircraft. Since each avionics system may generate different RF energy responses from the intentional RF energy, a plurality of different possible cockpit profiles may be stored and associated with a known good response (e.g., RF energy representation, baseline response).

The database of cockpit profiles and their respective associated received RF energy representations may be generated by exposure of each known good cockpit profile with the intentional RF energy and then recording the response. Each response is then stored with its respective profile in the database for future comparison of responses during actual testing. The database may further contain additional information associated with the cockpit profile that may affect the received RF energy representation. This information may include whether the empirical testing was performed with the avionics in a powered on or off state or the firmware/software version or versions for each avionics system installed in the cockpit that requires firmware/software to operate. For example, different operating software or firmware may control avionics elements at varying times which suggests dissimilar versions.

The connections 530 between the correlation/analysis circuitry 501 and the baseline database 505 may be a direct electrical connection or a wireless channel. The wireless channel may be Wi-Fi operating using one of the IEEE 802.11 standards. In another embodiment, the wireless channel is a cellular datalink (e.g., enhanced data rates for GSM evolution (EDGE), long term evolution (LTE)). For example, instead of the database 505 being located with the rest of the system, it may be located remotely with a server and connected to the Internet or some other network (e.g., local area network, wide area network). Locating the database 505 away from the system may enable easier and/or more reliable updates of the database that may then be accessed by a number of different aircraft systems testing system.

Similarly, the connection 531 of the correlation/analysis circuitry 501 to the output circuit 510 may be a direct electrical connection or a wireless channel. For example, instead of being located with the rest of the system, the output circuit 510 may be a display or printer at a maintenance facility on or near the airport. The system may thus directly inform the mechanics of a problem with a particular aircraft. The system may output both the aircraft identification as well as the associated test results.

In some embodiments, FNLE can be used to convert components that are not typically part of a radio, into a radio. FNLE signals transmitted from a device can be received at another device and decoded into data. The data can indicate, for example that a specific software application is operating on the device, a version of the software, a circuit is present, one or more symbols or characters, or the like.

It is known that an I/O pin can be used to generate radio signals that can be detected at ranges of many feet. Embodiments herein do not rely on this modality and supersede this mechanism. Embodiments use knowledge of the circuitry of the illuminated device beyond the I/O pin. Embodiments can include analysis of conducting paths of the device and the interaction of the signals produced on the conducting paths with other RF energy.

The process can include determining which internal signaling systems have exposed conductive runs (e.g., traces, buses, pads, or the like) connected thereto. These runs can include printed circuit board (PCB) copper lines but can include wires or other unshielded conductors in the system. The length of the conductor, the electrical current available, or the operating voltage, can be used to calculate the expected field strength produced by the conductor. This calculation can be done using known engineering practices to determine the electromagnetic field. This electromagnetic field is proportional to the current and related to the frequency of the signal with respect to the length of the conductive run, as well as interaction with other devices around conductor.

After the prospective elements are identified, a set of tests can be done to determine the signal strength and the exciting signal that produces decipherable FNLE. The re-emission can be at even harmonics of the signal on the conductor. This is at least partially because the re-emission is aided by the change in a semiconductor termination changing its principle characteristic from capacitor to inductor at a critical frequency. This is not the same as the characteristic based on the rectifying characteristics of a PN junction that produces signals at the odd harmonics.

The FNLE re-emission tests can be performed by sweeping a signal generator creating a continuous wave with pulse power bursts. This waveform has been determined to produce a superior signal as compared to a continuous wave signal with no power bursts. The frequency of the CW signal can be swept in a range guided by understanding of the nature of the physical characteristics of the device. The frequency that caused the peak signals and one or more characteristics of the peak signals can be recorded as markers. A peak signal is a signal with some local maximum, for example an FNLE signal with a highest voltage at a frequency. To produce these signals a simultaneous process to generate the signal on the device can be performed.

After the basic layout of the device is known, the conductors can be identified. There is usually a small set of conductors used in most devices. Examples of common buses are universal serial bus (USB), serial peripheral interface (SPI), and a control area network (CAN) bus. These buses have predictable signals, are comparatively high current compared to other signal lines in most devices and have longer than average conductor lengths. In some embodiments, these conductors can be exposed outside of RF shielding of the device.

A controller can cause non-destructive and non-interfering (in terms of interfering with other operation of the device) variations (e.g., duty cycle, frequency, amplitude, etc.) in the signal on the conductor. These variations can be specific to the bus. These variations can include varying a timer associated with building the waveform, injecting a signal on the conductor, such as during idle time, and sending a non-standard signal (for a short temporal duration) that produces RF when illuminated by an external signal but is not interpreted by devices on the bus. The FNLE produced by the device can be interpreted by another device. The interpretation can include a decoding that indicates the data transmitted by the device (by tracking a set of markers and their timing). The data can be decoded. The external RF channel can be covert, such to be unknown by other software or RF monitors.

Figure 6:
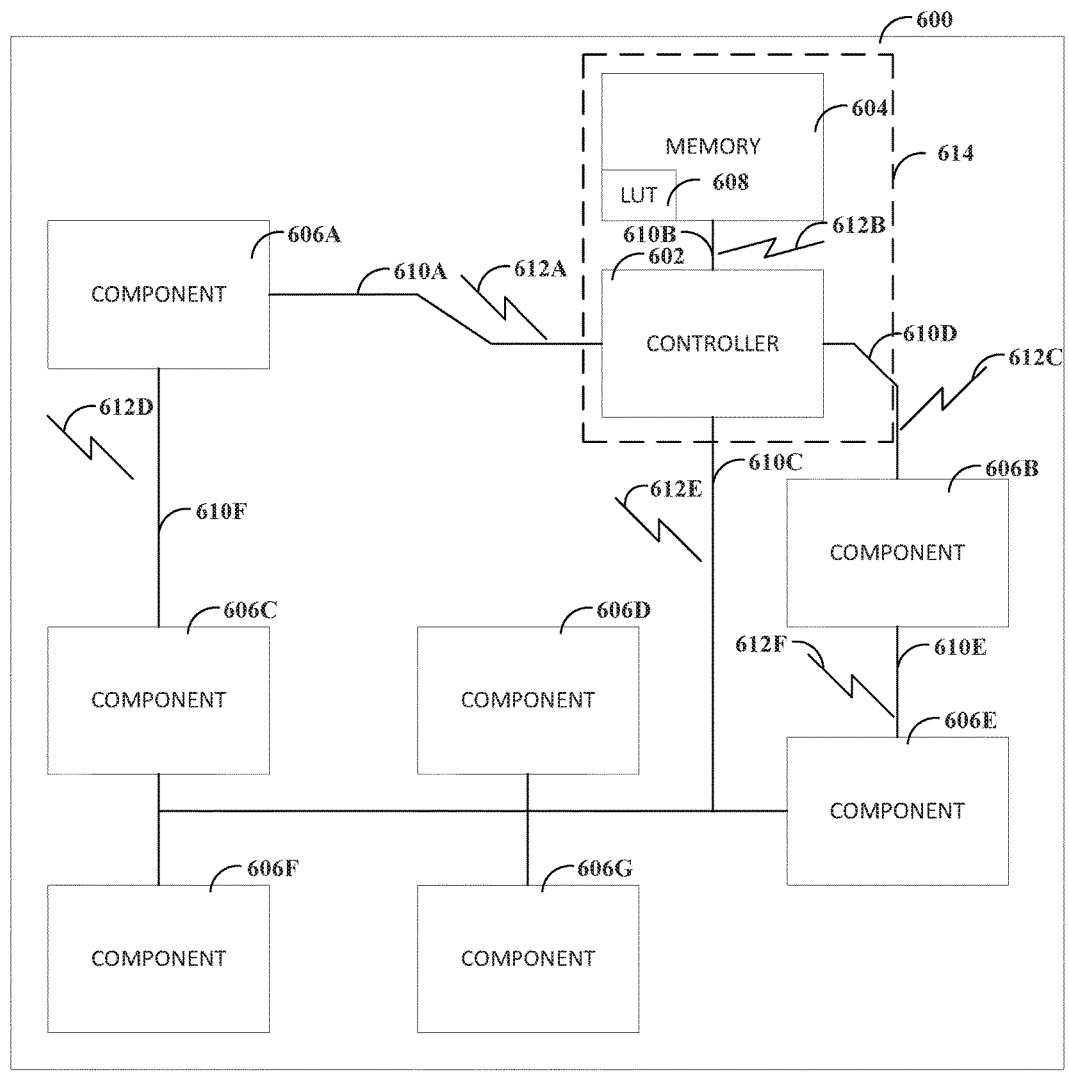
FIG. 6 illustrates, by way of example, a diagram of an embodiment of a device.

FIG. 6 illustrates, by way of example, a diagram of an embodiment of a device 600. The device 600 as illustrated includes a controller 4602, a memory 604, and a plurality of electrical or electronic components 606A, 606B, 606C, 606D, 606E, 606F, and 606G electrically connected by conductors 610A, 610B, 610C, 610D, and 610E. The controller 602 can be similar to the controller 502 and vice versa. In some embodiments, the device 600 can include an RF shielding 614.

The controller 602 can include processing circuitry, such as a central processing unit (CPU), logic gates (e.g., AND, OR, XOR, negate, or buffer gates), a field programmable gate array (FPGA), application specific integrated circuit (ASIC), oscillator, multiplexer, switch, or the like. The controller 602 can be configured to control operations of the memory 604 and components 606A-606G. The controller 602 can provide one or more electrical signals to the component 606A-606G to alter an operation of the component 606A-606G.

The component 606A-606G can include one or more electrical or electronic components such as can include a resistor, transistor, inductor, capacitor, diode, regulator, power supply, analog to digital converter, digital to analog converter, rectifier, processor, logic gate, multiplexer, switch, oscillator, flip flop, modulator, demodulator, phase locked loop, port (e.g., a USB port, Ethernet port), circuitry configured to conform to a communication standard, such as USB, WiFi, LTE, institute of electrical and electronics engineers (IEEE) 802.11, or the like. The operation of the component 606A-606G can be adjusted so that an FNLE 612A, 612B, 612C, 612D, or 612E has a specified characteristic. The characteristic can include a specified frequency, multiple frequencies or harmonics, an amplitude, a frequency delta between frequency peaks above a specified threshold, a time delta between FNLE signals with a specified characteristic, or the like. The controller 602 can determine, based on data in the memory 604, such as in a lookup table (LUT) 608, how to alter the component 606A-606G to cause the generate FNLE with a specified characteristic.

An entry of the LUT 608 can include data indicating how to configure the components 606A-606G to generate FNLE with a specified characteristic under a specified illumination. The entry of the LUT 608 can include one or more of a symbol, component identification(s), and component configuration. The symbol can indicate information that is transmitted by configuring the component(s) associated with the component identification(s) in the manner indicated by the component configuration. The component identification can indicate to which component 606A-606E the component configuration data corresponds. The component configuration data can indicate how to alter the component. The alteration to the component can include a duty cycle, an oscillator frequency, a duration of the change, a component current state, or the like.

The RF shielding 614 can be configured to protect a component therein from RF signals external to the RF shielding 614. In the example of FIG. 6, the RF shielding 614 can protect the memory 604 and the controller 602 from external RF signals. The RF shielding 614 can prevent FNLE, such as the FNLE 612B from being transmitted external to the device 600. The conductor 610B, may be prevented from being used as a transmit device. In some embodiments, only those conductors 610A-610F that are external from RF or other metallic shielding can be used as transmitters or receivers.

Figure 7:
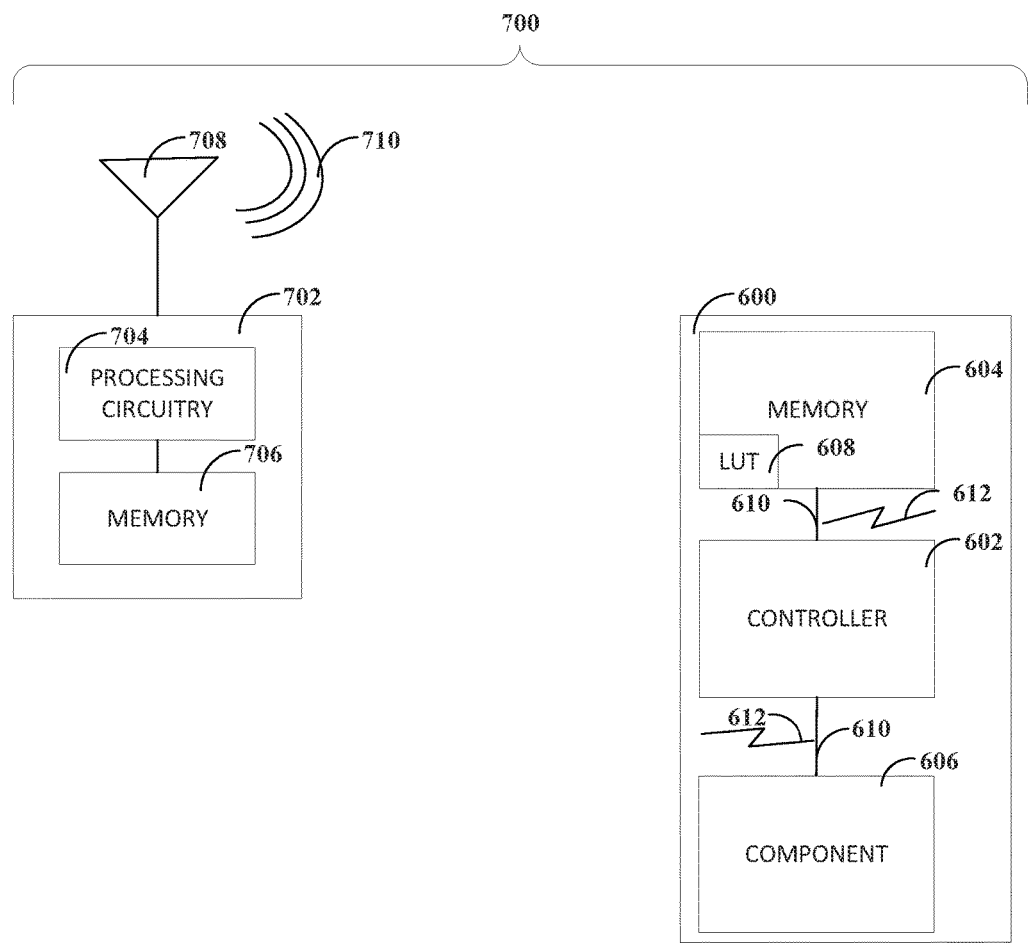
FIG. 7 illustrates, by way of example, a diagram of an embodiment of a system for transmitting and receiving data from FNLE.

FIG. 7 illustrates, by way of example, a diagram of an embodiment of a system 700 for transmitting and receiving data from FNLE. The system 700 as illustrated includes the device 600 from FIG. 6 and a wireless communication device 702. In the device 600, some of the items include reference numbers without subscripts. These reference numbers refer generally to corresponding reference numbers with subscripts in FIG. 6. For example, the component 606 of FIG. 7 refers generally to one or more of any of the components 606A-606G in FIG. 6. In another example, the FNLE 612 of FIG. 7 refers generally to one or more of any of the conductors 610A-610F of FIG. 6.

The wireless communication device 702 as illustrated includes processing circuitry 704, a memory 706, and an antenna 708. The processing circuitry 704 can include one or more electrical or electronic components electrically coupled to perform operations of the wireless communication device 702. The electrical or electronic components of the processing circuitry 704 can include components discussed previously regarding the components 606A-606G, the controller 602, or the memory 604.

The processing circuitry 704 can be configured to cause the antenna 708 to produce radio frequency transmissions 710. The radio frequency transmissions 710 can be at a specified power, direction, frequency or frequencies, duration, duty cycle, or the like. The radio frequency transmissions 710 can be at a direction to be incident on the device 600. The RF transmissions can cause the FNLE 612 of the device 600.

The memory 706 can include data regarding the RF transmissions 710 to be generated. For example, the memory 706 can include a schedule indicating a time at which to generate the RF transmissions 710, a table, array, or other data structure that associates characteristics of FNLE 612 incident on the antenna to a corresponding meaning. The meaning can include a word, character, symbol, phrase, or the like. Then, when FNLE 612 is incident on the antenna 708, it can be decoded into a meaning.

The component 606 or the controller 602 can include a detector to determine when the RF transmission 710 is incident on the device 600. The detector can include a sensor or other transducer that detects the electromagnetic waves of the RF transmission 710 and produces a signal indicating that the electromagnetic wave includes a specified characteristic (e.g., an amplitude above a specified threshold, a frequency component with an amplitude above a specified threshold, or the like). The In this manner, the device 600 can be converted into a transmitter without adding the usual transmitter radio components, such as a modulator, demodulator, antenna, or the like. In response to the signal indicating the electromagnetic waves of the RF transmission 710 includes the specified characteristic, the controller 602 can alter the operation of one or more of the component(s) 606. The alteration can cause the component(s) 606 to generate one or more electrical signals on the conductor(s) 610. The electrical signals can mix with the RF transmission 710 to generate the FNLE 612.

Figure 8:
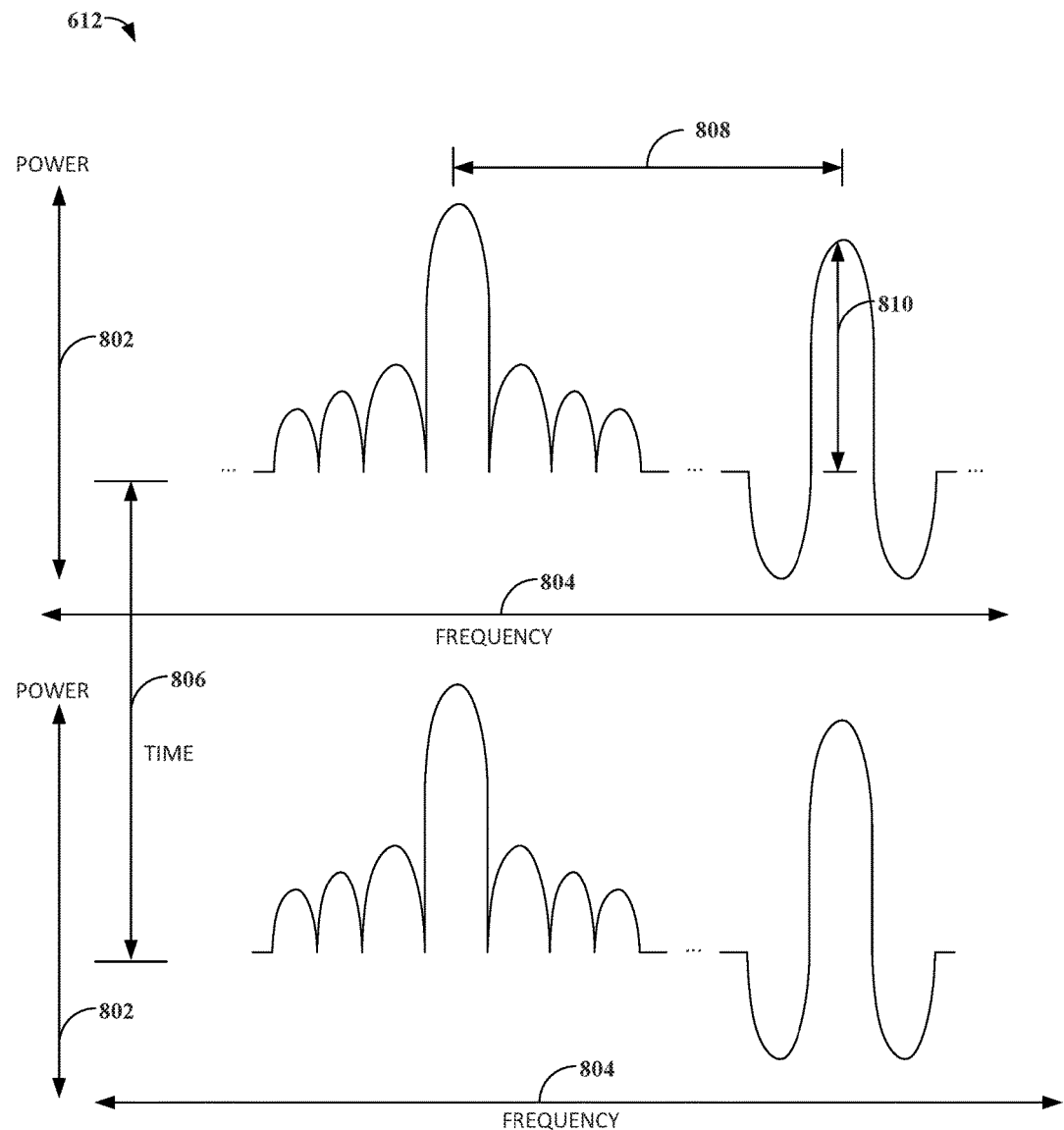
FIG. 8 illustrates, by way of example, a diagram of an embodiment of the FNLE.

In other embodiments, the wireless communication device 702 can include a timer that is synched with and follow a schedule of FIG. 8 illustrates, by way of example, a diagram of an embodiment of the FNLE 612.

FIG. 8 illustrates a variety of characteristics of the FNLE 612 produced by the device 600 that can be decoded to determine data transmitted thereby. The FNLE 612 is illustrated as frequency 804 vs. power 802 plots of electromagnetic energy received at the device 702. Variations in the FNLE 612 can correspond to data to be transmitted by the device 600. For example, a delta between frequency peaks (peaks greater than a specified power threshold), as indicated by line 808. In another example, an amplitude of a frequency peak within a range of frequencies can correspond to data, as indicated by line 810. In yet another example, a time between receipt of FNLE can correspond to data, as indicated by line 806.

Decoding the FNLE 612 can be used to identify operational characteristics, physical characteristics, or other information transmitted by the device 600. Operational and physical analysis of the device 600 using FNLE can be accomplished in a variety of ways. Operational analysis and physical analysis can include similar operations. These analyses can be performed by the processing circuitry 704.

Physical analysis can include using an FNLE spectrum (e.g., characteristics of received FNLE) to assess the current physical characteristics of a device, as well as any changes to said device. A variety of techniques can be used to perform this analysis. For example, presence of re-emission artifacts related to device Input/Output (TO) busses. For example, if a USB bus is operating, FNLE can be used to detect the presence of the bus, therefore formulating a subset of the overall hardware makeup of the device. The culmination of I/O busses detected fill out part of the picture of the physical analysis.

Multi-tone FNLE extraction can be used to observe additional physical characteristics of a device. When two signals are transmitted and combine within a nonlinear device or component, the output contains the original signals plus additional mixing products. Characterization of these additional mixing product signals for a variety of physical components can be done to create FNLE models for hardware. These models can be created a variety of ways. These can be as simple as frequency, spectral power, or signal change over time distribution metrics or more complicated statistical classification or machine learning techniques utilizing analysis of n-levels of n-features within the spectrum.

Like physical analysis, operational analysis can include, if an I/O bus is operating, FNLE can be used to detect said operation. Additionally, if multiple I/O busses are present in the device, the pattern, frequency, and timing of these I/O operations can be analyzed to further understand device operation. Low frequency sidebands can be analyzed to gain even further insight into additional device operations other than I/O. These signals are created naturally during device operation and are extracted via FNLE. By performing characterization of these signals either total operational models or models of basic machine code blocks or functions can be created to understand the operation of a device.

Figure 9:
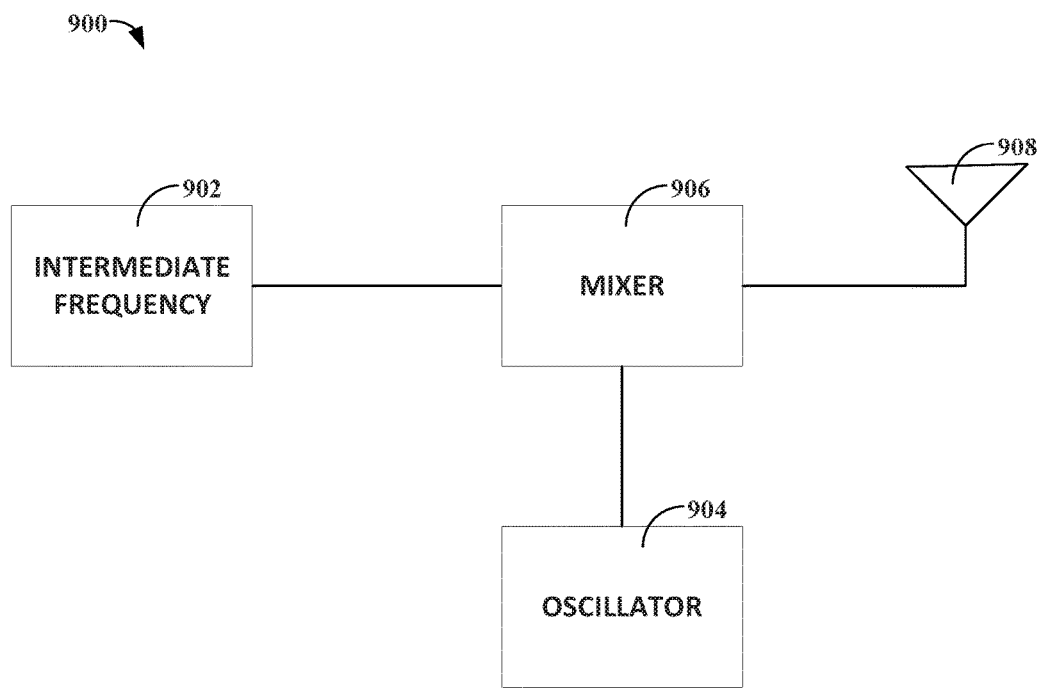
FIG. 9 illustrates, by way of example, a diagram of an embodiment of a radio 900.

FIG. 9 illustrates, by way of example, a diagram of an embodiment of a radio 900. The radio 900 can be used as a receive radio, a transmit radio, or a combination thereof, sometimes called a transceiver. The radio 900 as illustrated includes an intermediate frequency 902, an oscillator 904, a mixer 906, and an antenna 908. The intermediate frequency 902 or the oscillator 904 can be provided by a radio frequency transmission 710 external to the device that includes the radio 900. The mixer 906 and the antenna 908 can be provided by the conductor 610. The antenna is the conductor line itself. The mixer 906 represents the non-linear mixing of the intermediate frequency 902 and the oscillator 904.

The RF transmission 710 can provide the intermediate frequency 902 and the device 600 can provide the oscillator 904, or visa-versa (either way, the intermediate frequency 902 and the oscillator 904 are non-linearly mixed and the output is the same either way). Different conductors 610A-610F of the device 600 can be repurposed to be a receiver or a transmitter.

The RF transmission signal 710 is the incoming signal (see FIG. 7). As described previously, the traces and busses are examples of conductors 610. There is no requirement to add an antenna to the system. The RF transmission signals 710 can be designed to interact with specific conductors 610 with the controller 602 or other component 606 providing a clock or other oscillating signal. The RF transmission signal 710 and oscillator 704 or a data or power signal non-linearly mix to provide the intermediate signal 702 (in the example of the radio 900 operating as a receiver). The device 600 can then sample that signal to provide a coherent reception. An ADC can be used to sample the signal. Even if connected to some form of digital input, the signal can be oversampled enough to gather the coherent signal.

Figure 10:
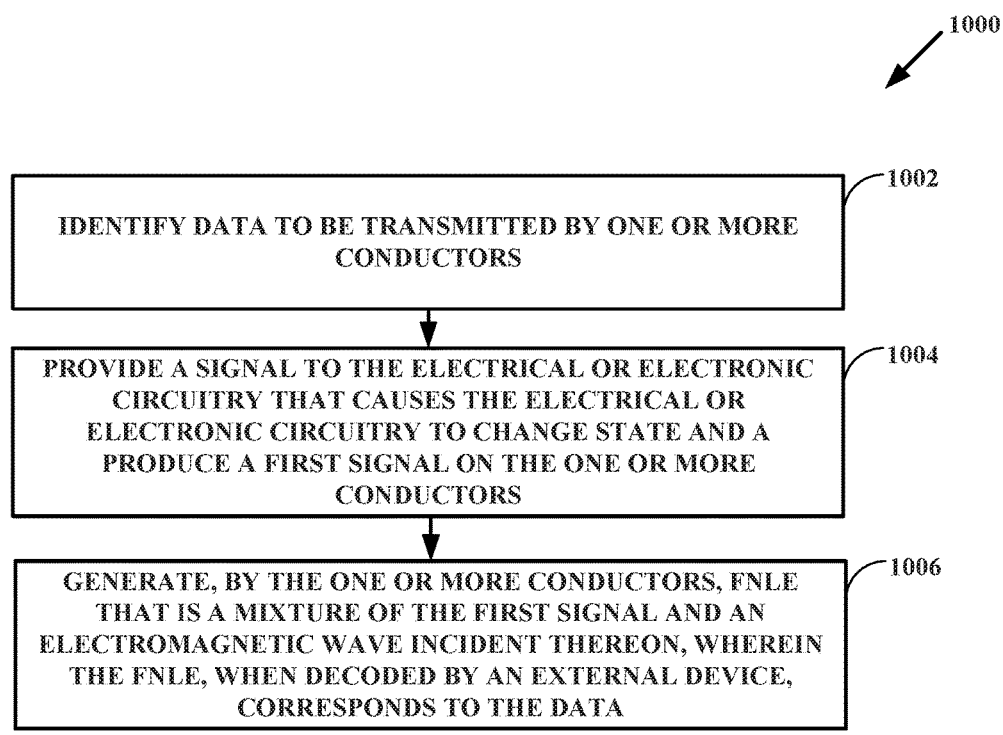
FIG. 10 illustrates, by way of example, a diagram of an embodiment of a method 1000 for using a non-antenna conductor as a transmitter.

FIG. 10 illustrates, by way of example, a diagram of an embodiment of a method 1000 for using a non-antenna conductor as a transmitter. The method 1000 can be performed by the device 600. The method 1000 as illustrated includes identifying data to be transmitted by the one or more conductors, at operation 1002; providing a signal to the electrical or electronic circuitry to cause the electrical or electronic circuitry to change state and produce a first signal on the one or more conductors, at operation 1004; and generating, by the one or more conductors, a forced non-linear emission (FNLE) that is a mixture of the first signal and an electromagnetic wave incident thereon that, when decoded by an external device, corresponds to the data.

The method 1000 can further include detecting the electromagnetic wave incident thereon. The operation 1004 can be performed in response to detecting the electromagnetic wave incident thereon. The operation 1004 can be performed in response to identifying that a schedule indicates that the electromagnetic wave will be or is incident one the one or more conductors. The change of state can include changing one or more of a frequency, power, duty cycle, and duration of the first signal. The device performing the method 1000 may not include a radio.

The first signal can be produced at a time when the electrical or electronic circuitry is to be in an idle state. The method 1000 can further include, wherein the one or more conductors are outside of an RF shielding of the device. The method 1000 can further include, wherein the one or more conductors are exposed. The method 1000 can further include, wherein the one or more conductors include a universal serial bus (USB), serial peripheral interface (SPI), or control area network (CAN) bus. The method 1000 can further include identifying, by a memory of the device including a lookup table, data indicating a state of the electrical or electronic circuitry and information that is transmitted by FNLE produced when the electrical or electronic circuitry is in the respective state.

Figure 11:
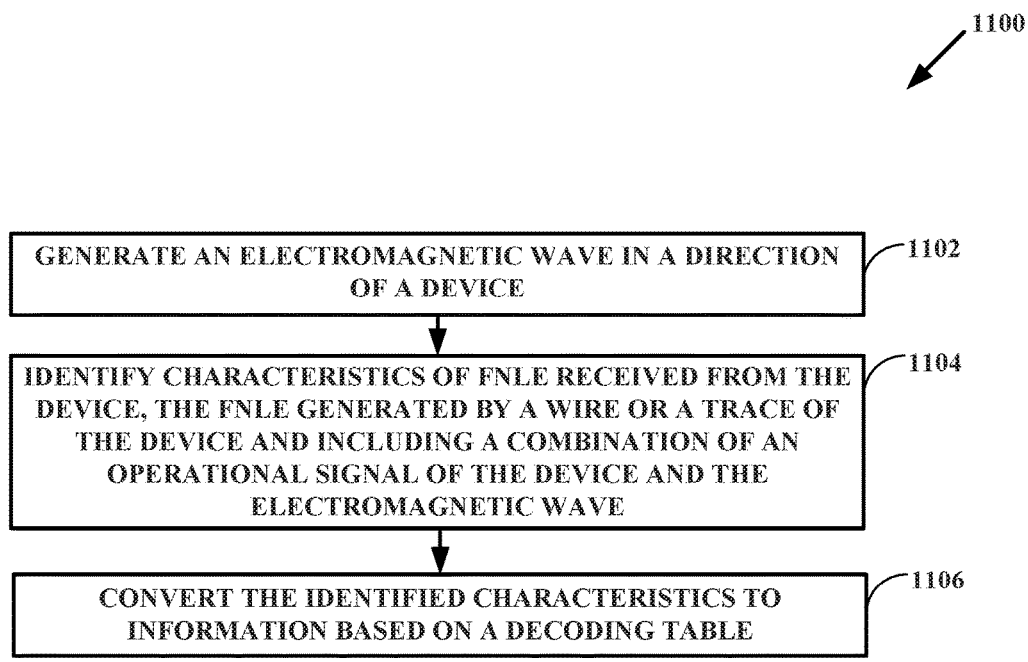
FIG. 11 illustrates, by way of example, a diagram of an embodiment of another method 1100 for using a non-antenna conductor as a transmitter.

FIG. 11 illustrates, by way of example, a diagram of an embodiment of another method 1100 for using a non-antenna conductor as a transmitter. The method 1100 can be performed by the device 700. The method 1100 as illustrated includes generating an electromagnetic wave in a direction of a device, at operation 1102; identifying characteristics of FNLE received from the device, (the FNLE generated by a wire or a trace of the device and including a combination of operational signals of the device and the electromagnetic wave), at operation 1104; and converting the identified characteristics to information based on the decoding table, at operation 1106. The method 1100 can further include storing the information in the memory or causing a display to provide a view of the information. The method 1100 can further includes, wherein the characteristics include one or more of a frequency, amplitude, time between FNLE, or a delta between frequency peaks of the FNLE. The operation 1102 can occur in response to identifying that a schedule indicates that the electromagnetic wave is to be incident on the conductors at a specified time.

Each of these non-limiting examples can stand on its own or can be combined in various permutations or combinations with one or more of the other examples.

Example 1 includes a device comprising electrical or electronic circuitry, one or more conductors (e.g., non-antenna conductors) including one or more wires or traces electrically coupled to the electrical or electronic circuitry, processing circuitry electrically coupled to the one or more conductors and electrical or electronic circuitry, wherein the processing circuitry is configured to perform operations comprising identifying data to be transmitted by the one or more conductors, and providing a signal to the electrical or electronic circuitry to cause the electrical or electronic circuitry to change state and produce a first signal on the one or more conductors, and wherein the one or more conductors produce a forced non-linear emission (FNLE) that is a mixture of the first signal and an electromagnetic wave incident thereon that, when decoded by an external device, corresponds to the data.

In Example 2, Example 1 further includes, wherein the operations further include detecting the electromagnetic wave incident thereon.

In Example 3, Example 2 further includes, wherein providing the signal to the electrical or electronic circuitry is in response to detecting the electromagnetic wave incident thereon.

In Example 4, at least one of Examples 1-3 further includes, wherein providing the signal to the electrical or electronic circuitry is in response to identifying that a schedule indicates that the electromagnetic wave will be or is incident one the one or more conductors.

In Example 5, at least one of Examples 1-4 further includes, wherein the change of state includes changing one or more of a frequency, power, duty cycle, and duration of the first signal.

In Example 6, at least one of Examples 1-5 further includes, wherein the device does not include a radio.

In Example 7, at least one of Examples 1-6 further includes, wherein the first signal is produced at a time when the electrical or electronic circuitry is to be in an idle state.

In Example 8, at least one of Examples 1-7 further includes, wherein the one or more conductors are outside of an RF shielding.

In Example 9, at least one of Examples 1-8 further includes, wherein the one or more conductors are exposed.

In Example 10, at least one of Examples 1-9 further includes, wherein the one or more conductors include a universal serial bus (USB), serial peripheral interface (SPI), or control area network (CAN) bus.

In Example 11, at least one of Examples 1-10 further includes a memory including a lookup table, the lookup table including data indicating s state of the electrical or electronic circuitry and information that is transmitted by FNLE produced when the electrical or electronic circuitry is in the respective state.

Example 12 includes a non-transitory machine-readable medium including instructions sored thereon that, when executed by a machine, configure the machine to perform operations of the processing circuitry of one of Examples 1-11.

Example 13 includes a method of performing the operations of the processing circuitry of Examples 1-11.

Example 14 includes a device comprising a memory including a decoding table indicating forced non-linear emission (FNLE) characteristics and information associated with FNLE that include the characteristics, processing circuitry electrically coupled to the memory, the processing circuitry configured to perform operations comprising generating an electromagnetic wave in a direction of a device, identifying characteristics of FNLE received from the device, the FNLE generated by a wire or a trace of the device and including a combination of operational signals of the device and the electromagnetic wave, converting the identified characteristics to information based on the decoding table, and storing the information in the memory or causing a display to provide a view of the information.

In Example 15, Example 14 further includes, wherein the characteristics include one or more of a frequency, amplitude, time between FNLE, or a delta between frequency peaks of the FNLE.

In Example 16, at least one of Examples 14-15 further includes, wherein generating the electromagnetic waves occurs in response to identifying that a schedule indicates that the electromagnetic wave is to be incident on the conductors at a specified time.

Example 17 includes a non-transitory machine-readable medium including instructions sored thereon that, when executed by a machine, configure the machine to perform operations of the processing circuitry of one of Examples 14-16.

Example 18 includes a method of performing the operations of the processing circuitry of Examples 14-16.

The above detailed description includes references to the accompanying drawings, which form a part of the detailed description. The drawings show, by way of illustration, specific embodiments in which some embodiments can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the embodiments should be determined with reference to the appended claims, along with the full scope of equivalents to which such claims are entitled.

The invention claimed is:

1. A device comprising:
    electrical or electronic circuitry;
    one or more conductors including one or more wires or traces electrically coupled to the electrical or electronic circuitry;
    processing circuitry electrically coupled to the one or more conductors and electrical or electronic circuitry, wherein the processing circuitry is configured to perform operations comprising:
        identifying data to be transmitted by the one or more conductors; and
        providing a signal to the electrical or electronic circuitry to cause the electrical or electronic circuitry to change state and produce a first signal on the one or more conductors; and
    wherein the one or more conductors produce a forced non-linear emission (FNLE) that is a mixture of the first signal and an electromagnetic wave incident thereon that, when decoded by an external device, corresponds to the data.

2. The device of claim 1, wherein the operations further include detecting the electromagnetic wave incident thereon.

3. The device of claim 2, wherein providing the signal to the electrical or electronic circuitry is in response to detecting the electromagnetic wave incident thereon.

4. The device of claim 1, wherein providing the signal to the electrical or electronic circuitry is in response to identifying that a schedule indicates that the electromagnetic wave will be or is incident on the one or more conductors.

5. The device of claim 1, wherein the change of state includes changing one or more of a frequency, power, duty cycle, and duration of the first signal.

6. The device of claim 1, wherein the device does not include a radio.

7. The apparatus of claim 1, wherein the first signal is produced at a time when the electrical or electronic circuitry is to be in an idle state.

8. The apparatus of claim 1, wherein the one or more conductors are outside of an RF shielding.

9. The apparatus of claim 1, wherein the one or more conductors are exposed.

10. The apparatus of claim 1, wherein the one or more conductors include a universal serial bus (USB), serial peripheral interface (SPI), or control area network (CAN) bus.

11. The apparatus of claim 1, further comprising:
    a memory including a lookup table, the lookup table including data indicating s state of the electrical or electronic circuitry and information that is transmitted by FNLE produced when the electrical or electronic circuitry is in the respective state.

12. A non-transitory machine-readable medium including instructions that, when executed by a machine, configure the machine to perform operations comprising:
    identifying data to be transmitted by one or more non-antenna conductors; and
    providing a signal to electrical or electronic circuitry of the machine to cause the electrical or electronic circuitry to change state and produce a first signal on the one or more non-antenna conductors; and
    wherein the one or more non-antenna conductors produce a forced non-linear emission (FNLE) that is a mixture of the first signal and an electromagnetic wave incident thereon that, when decoded by an external device, corresponds to the data.

13. The non-transitory machine-readable medium of claim 12, wherein the operations further include detecting the electromagnetic wave incident thereon.

14. The non-transitory machine-readable medium of claim 13, wherein providing the signal to the electrical or electronic circuitry is in response to detecting the electromagnetic wave incident thereon.

15. The non-transitory machine-readable medium of claim 12, wherein providing the signal to the electrical or electronic circuitry is in response to identifying that a schedule indicates that the electromagnetic wave will be or is incident on the one or more conductors.

16. The non-transitory machine-readable medium of claim 12, wherein the change of state includes changing one or more of a frequency, power, duty cycle, and duration of the first signal.

17. A method comprising:
    identifying, by processing circuitry of a device, data to be transmitted by one or more non-antenna conductors of the device; and
    providing, by the processing circuitry, a signal to electrical or electronic circuitry of the machine to cause the electrical or electronic circuitry to change state and produce a first signal on the one or more non-antenna conductors; and
    wherein the one or more non-antenna conductors produce a forced non-linear emission (FNLE) that is a mixture of the first signal and an electromagnetic wave incident thereon that, when decoded by an external device, corresponds to the data.

18. The method of claim 17, wherein the device does not include a radio.

19. The method of claim 17, wherein the first signal is produced at a time when the electrical or electronic circuitry is to be in an idle state.

20. The method of claim 17, further comprising:
    identifying, by a memory of the device including a lookup table, data indicating a state of the electrical or electronic circuitry and information that is transmitted by FNLE produced when the electrical or electronic circuitry is in the respective state.

* * * * *

UNITED STATES PATENT AND TRADEMARK OFFICE
CERTIFICATE OF CORRECTION

PATENT NO. : 10,295,593 B2
APPLICATION NO. : 16/193713
DATED : May 21, 2019
INVENTOR(S) : Shake et al.

It is certified that error appears in the above-identified patent and that said Letters Patent is hereby corrected as shown below:

On the Title Page

On page 2, in Column 1, under "Other Publications", Line 19, delete "Apr. 30, 218" and insert --Apr. 30, 2018-- therefor In the Specification In Column 10, Line 26, delete "4602," and insert --602,-- therefor In Column 12, Line 41, delete "(TO)" and insert --(IO)-- therefor In Column 13, Line 31, delete "704" and insert --904-- therefor Signed and Sealed this
Twenty-second Day of December, 2020

Andrei Iancu
*Director of the United States Patent and Trademark Office*